(12) United States Patent
Edel (10) Patent No.: US 6,590,380 B2
(45) Date of Patent: Jul. 8, 2003

(54) METHOD AND APPARATUS FOR COMPENSATION OF CURRENT TRANSFORMER ERROR

(76) Inventor: Thomas G. Edel, 9232 N. Tyler Ave., Portland, OR (US) 97203-2356

(*) Notice: Subject to any disclaimer, the term of this patent is extended or adjusted under 35 U.S.C. 154(b) by 77 days.

(21) Appl. No.: 09/995,930

(22) Filed: Nov. 28, 2001

(65) Prior Publication Data

US 2002/0070724 A1 Jun. 13, 2002

Related U.S. Application Data

(60) Provisional application No. 60/254,663, filed on Dec. 11, 2000.

(51) Int. Cl.[7] .......................... G01R 21/00; H01F 38/28
(52) U.S. Cl. .................... 324/127; 324/117 R; 323/357
(58) Field of Search ........................... 324/117 R, 127; 323/356, 357, 358; 702/85, 86

(56) References Cited

U.S. PATENT DOCUMENTS

| | | | |
|---|---|---|---|
| 3,534,247 A | 10/1970 | Miljanic | |
| RE28,851 E | 6/1976 | Milkovic | |
| 4,032,836 A | * 6/1977 | Gross | 323/356 |
| 4,198,595 A | 4/1980 | Milkovic | |
| 4,536,706 A | * 8/1985 | Kemper | 324/117 R |
| 4,847,554 A | * 7/1989 | Goodwin | 324/127 |
| 5,563,506 A | 10/1996 | Fielden et al. | |
| 6,072,310 A | 6/2000 | Krebs et al. | |
| 6,239,589 B1 | 5/2001 | Windsheimer | |
| 6,479,976 B1 | * 11/2002 | Edel | 323/357 |

OTHER PUBLICATIONS

Kang, Y.C.; Park, J.K.; Kang, S.H.; Johns, A.T.; Aggarwal, R.K.; "An Algorithm for Compensating Secondary Currents of Current Transformers"; IEEE Transactions on Power Delivery, vol. 12, No. 1, Jan. 1997, pp. 116–124.

Locci, Nicola; Muscas, Carlo; "A Digital Compensation Method for Improving Current Transformer Accuracy"; IEEE Transactions on Power Delivery, vol. 15, No. 4, Oct. 2000, pp. 1104–1109.

Slomovitz, D; "Electronic Error Reduction System for Clamp-On Probes and Measuring Current Transformers"; IEEE Transactions on Instrumentation and Measurement, vol. 49, No. 6, Dec. 2000, pp. 1278–1281.

TAM, KES; "Current Transformer Phase-Shift Compensation and Calibration"; Texas Instruments, Application Report SLAA122, Feb. 2001.

Yu, David C.; Cummins, James C.; Wang, Zhuding; Yoon, Hong-Jun; Kojovic, Ljubomir A.; "Correction of Current Transformer Distorted Secondary Currents Due to Saturation Using Artifical Neural Networks"; IEEE Transactions on Power Delivery, vol. 16, No. 2, Apr. 2001, pp. 189–194.

Locci, Nicola; Muscas, Carlo; "Hysteresis and Eddy Currents Compensation in Current Transformers"; IEEE Transactions on Power Delivery, vol. 16, No. 2, Apr. 2001, pp. 154–159.

* cited by examiner

*Primary Examiner*—Kamand Cuneo
*Assistant Examiner*—Russell M. Kobert (57) ABSTRACT

The exciting current of a current transformer is calculated and added to the measured secondary current to produce a corrected signal. The exciting current is calculated by first calculating the current transformer induced voltage. The induced voltage is calculated from a parameter related to secondary current and known characteristics of loop impedances through which secondary current flows. The parameter related to secondary current may be the secondary current itself, or a voltage associated with secondary current flowing through an impedance. The calculated induced voltage is then applied across an inductor having similar magnetic properties as the current transformer. By scaling the applied voltage properly, the current flowing in the inductor is approximately proportional to the exciting current of the current transformer. The current in the inductor is measured, and, by applying an appropriate constant of proportionality, the exciting current of the current transformer is determined. A corrected secondary current is then calculated by adding the calculated exciting current to the measured secondary current.

20 Claims, 6 Drawing Sheets

METHOD AND APPARATUS FOR COMPENSATION OF CURRENT TRANSFORMER ERROR

CROSS-REFERENCE TO RELATED APPLICATION

This application claims the benefit of U.S. Provisional Application No. 60/254,663, filed Dec. 11, 2000.

STATEMENT REGARDING FEDERALLY SPONSORED RESEARCH

Not Applicable

REFERENCE TO A MICROFICHE APPENDIX

Not Applicable

BACKGROUND OF THE INVENTION

This invention relates to the measurement of electric current using current transformers.

Most current monitoring systems for a-c (alternating-current) electric power systems utilize current transformers to provide input currents that are isolated from the electric power system conductors. A primary winding of a current transformer is connected in series with a current-carrying conductor while a secondary winding is magnetically coupled to the primary winding by a suitable magnetic core. A current is induced in the secondary winding that is proportional to the primary current. The secondary current is isolated from the primary current and is smaller than the primary current by the turns ratio of the primary and secondary windings. The primary winding frequently consists of only one turn, which is often just the current-carrying conductor installed through an opening in the middle of the current transformer magnetic core. The secondary winding usually consists of multiple turns wrapped around the magnetic core.

The accuracy of a current transformer is usually related to the coercive force of the magnetic core material (less is better), the cross sectional area of the magnetic core (bigger is better), the effective magnetic length of the magnetic core (shorter is better), any air gap in the magnetic core (less or none is better), and the "squareness" of the magnetic core material hysteresis curve (squarer may be preferred if not operating near saturation, otherwise characteristics that are not square may be preferred). Split-core current transformer cores generally have hysteresis curves that are less square than standard current transformer cores due to the small air gaps inherent in the design of split-core current transformers.

In order for the secondary current generated by a current transformer to be an accurate representation of the primary current, the impedance of the circuit connected to the secondary winding must be kept low so that current can flow freely. The impedance of the secondary circuit is often called the "burden." The burden generally includes all impedances in the loop through which the secondary current flows, including stray winding impedances, stray impedances of connecting conductors, and the impedances of any devices connected in the loop (such as current-sensing resistors and relay operating coils). In order for a current transformer to drive a secondary current through a non-zero burden, a voltage must be induced in the secondary winding. The induced voltage is proportional to secondary current and is proportional to the burden, in accordance with Ohm's law. The induced voltage is induced in the secondary winding by a fluctuating induction level in the magnetic core (the instantaneous magnitude of induced voltage being proportional to the rate of change of magnetic flux). The fluctuating induction level is associated with an "exciting current" in accordance with well-known electromagnetic principles. The exciting current is often understood to have a magnetizing component and a core loss component. The exciting current accounts for most of the error in the secondary current. Generally speaking, the accuracy of a current transformer is inversely related to the burden of the secondary circuit. A higher burden causes the current transformer to operate with greater induced voltage, thereby increasing the exciting current, thereby causing the secondary current to be a less accurate representation of the primary current.

As used herein, the phrase "induction level" is synonymous with "magnetic induction level," and refers to the amount of magnetic flux within a magnetic core.

To improve current transformer accuracy, it is common practice to try to minimize the burden of the secondary circuit. Two ways of minimizing the secondary circuit burden are:

(a) Utilize a current-sensing resistor with relatively small resistance, along with a sensitive amplifier.

(b) Utilize an active load to sense current (an active load can have an effective burden of virtually zero Ohms).

While both of these methods are able to reduce the burden of the current-sensing device, they have no effect on the burden of the rest of the secondary circuit (secondary winding impedances and the stray impedances of connecting conductors). It is therefore desirable to compensate for current transformer error even when current-sensing devices with low burdens are utilized.

Some specialized current transformers with multiple windings and/or multiple cores have been developed. Many of these transformers have greatly improved accuracy. However, most of these specialized transformers are prohibitively expensive for many applications.

Prior art methods for compensation of current transformer error include applying simple correction factors based on current magnitude. Correction factors may be used to correct both current magnitude and phase angle. While these methods may be suitable for some applications, they are often inadequate.

Some have developed compensation schemes based on digital signal processing techniques with some success. The goal has been to simulate the hysteresis properties of the magnetic core with mathematical models and calculate the exciting current error. However, these methods require significant processing capabilities to deal with the nonlinearities involved. Even when simplifying assumptions are made the computation task is difficult.

To overcome the limitations of the prior art, an analog means of accurately compensating for current transformer error is desirable. It is also desirable that a compensation circuit be suitable for use with standard current transformers, both new current transformers and those already in service.

BRIEF SUMMARY OF THE INVENTION

The invention calculates the exciting current of a current transformer and adds this to the measured secondary current to produce a corrected signal. The exciting current is calculated by first calculating the current transformer induced voltage. The induced voltage is calculated from a parameter related to secondary current and known characteristics of loop impedances through which secondary current flows. The parameter related to secondary current may be the secondary current itself, or a voltage associated with secondary current flowing through an impedance.

The calculated induced voltage is then applied across an inductor having similar magnetic properties as the current transformer. By scaling the applied voltage properly, the current flowing in the inductor is approximately proportional to the exciting current of the current transformer. The current in the inductor is measured, and, by applying an appropriate constant of proportionality, the exciting current of the current transformer is determined. A corrected secondary current is then calculated by adding the calculated exciting current to the measured secondary current.

DETAILED DESCRIPTION OF THE INVENTION

Figure 1:
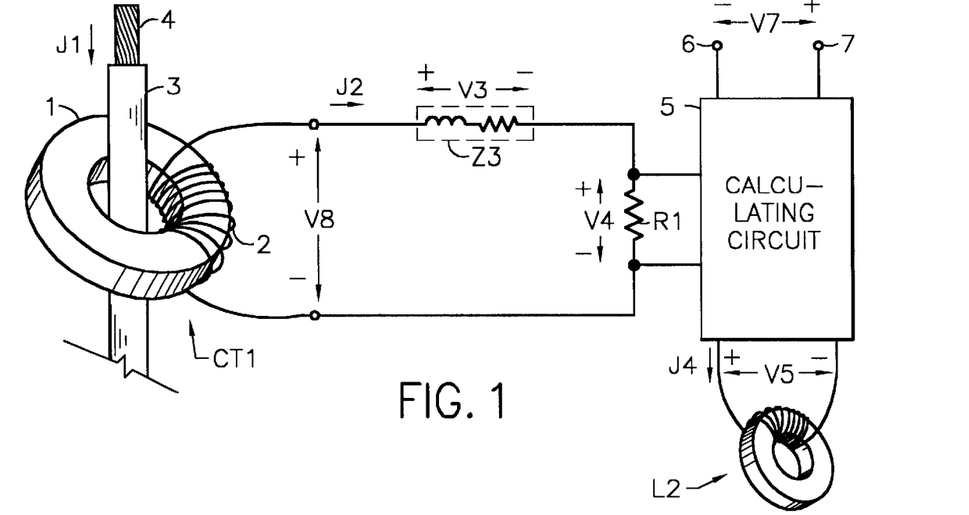
FIG. 1 illustrates the general configuration of a preferred embodiment. A current transformer CT1 causes a secondary current J2 to flow that is not exactly proportional to a primary current J1. A calculating circuit 5 receives an uncorrected current signal (voltage V4) from a current-sensing resistor R1, and provides a corrected current signal (voltage V7).

FIG. 1 illustrates the general concept by showing a current transformer CT1 comprising a magnetic core 1 and a secondary winding 2 wrapped around the magnetic core. An electric power system conductor 4 with an insulating covering 3 functions as a primary winding with only one turn, with a primary current J1 flowing. Though shown with one end disconnected, power system conductor 4 is normally connected as part of an electric power system. Though a toroid is shown for magnetic core 1, the invention is applicable to virtually any kind of current transformer with any form of magnetic core. The number of winding turns shown for secondary winding 2 is for illustration only, and may vary widely depending on the particular application. Of course, the invention is also applicable to current transformers with wound primary windings or with bar-type primary configurations.

Secondary current J2 is caused to flow by the transformer action of current transformer CT1 (in accordance with well-known current transformer principles). If current transformer CT1 were to have ideal properties, then secondary current J2 would have exactly the same waveform as primary current J1, with magnitude reduced exactly by the turns ratio of current transformer CT1. However, since current transformers generally do not have ideal properties, there is an error in secondary current J2. Calculating circuit 5 corrects for most of the error in secondary current J2.

In FIG. 1, a current-sensing resistor R1 with small resistance is connected in series with secondary winding 2 so that current J2 flows through resistor R1. The conductors that connect secondary winding 2 to resistor R1 have stray impedances represented by impedance Z3. Voltage V3 is the voltage drop associated with current J2 flowing through stray impedance Z3. Voltage V4 is the voltage across resistor R1, and is proportional to current J2. Voltage V4 and current J2 may both be referred to as an "uncorrected signal," or "uncorrected current signal." Calculating circuit 5 has high-impedance inputs to sense voltage V4, so that virtually all of current J2 flows through resistor R1. Voltage V8 is the secondary winding voltage that is measurable at the terminals of current transformer CT1.

Still referring to FIG. 1, calculating circuit 5 senses secondary current J2 (as voltage V4) and produces an output signal (voltage V7, across terminals 6 and 7) that is a more accurate representation of primary current J1 than is voltage V4. Voltage V7 may be referred to as a "corrected signal" or "corrected current signal." In FIG. 1, calculating circuit 5 is configured to produce an analog signal (voltage V7) that is instantaneously proportional to primary current J1. A voltage output is provided since most electronic processing methods are more easily configured to produce and measure voltages rather than currents. Of course, the corrected output could be configured to be a current signal rather than a voltage signal if so required for a particular application.

Calculating circuit 5 may alternatively be configured to produce an output that is a digital signal. Calculating circuit 5 may be configured as an integral part of a digital processing system, in which case the calculated current (the "corrected signal") may simply be a digital signal utilized by software for various calculations or control purposes.

Clarifying the basic operation of FIG. 1, calculating circuit 5 applies a voltage V5 to an inductor L2, resulting in current J4 flowing through inductor L2. Inductor L2 is preferably constructed with similar magnetic material as current transformer CT1 so that inductor L2 has hysteresis characteristics similar to current transformer CT1. Calculating circuit 5 causes voltage V5 to have a waveform similar to the voltage induced in the secondary winding of the current transformer. The induced voltage correlates to changing flux in the magnetic core (the induced voltage is proportional to the rate of change of magnetic flux in the current transformer core in accordance with Faraday's Law). Calculating circuit 5 applies a scale factor to voltage V5 so that the magnitude of voltage V5 causes the peak flux density of the magnetic core of inductor L2 to be approximately equal to the peak flux density of the current transformer magnetic core. Current J4 is then approximately proportional to the exciting current of current transformer CT1. By multiplying current J4 by an appropriate constant of proportionality and adding the result to measured current J2 (measured as voltage V4 across resistor R1), calculating circuit 5 calculates a corrected current that is accurately proportional to primary current J1. In FIG. 1, the corrected current is output as analog voltage signal V7. (As used herein, the phrase "apply a scale factor" is synonymous with the phrase "multiply by a constant of proportionality").

For simplicity of calculations and best accuracy, it may be advantageous to make the configuration of inductor L2 virtually identical to current transformer CT1. In this case voltage V5 should be made equal to the induced voltage of current transformer CT1, and current J4 will then be approximately equal to the exciting current of current transformer CT1. However, for economic and space considerations, it will usually be desirable to make inductor L2 physically smaller than current transformer CT1. The invention allows for this, with the clarification that voltage V5 must be scaled properly so that the peak flux density of the magnetic core of inductor L2 is approximately equal to the peak flux density of the current transformer magnetic core (assuming similar magnetic materials are used for each core). Current J4 will still be approximately proportional to the exciting current of current transformer CT1, and with proper scaling may be added to current J2 to obtain a corrected current that is accurately proportional to primary current J1.

More simply stated, calculating circuit 5 functions as a calculating means that calculates and produces inductor voltage V5 and adds inductor current J4 to secondary current J2 to calculate a corrected signal.

Figure 2:
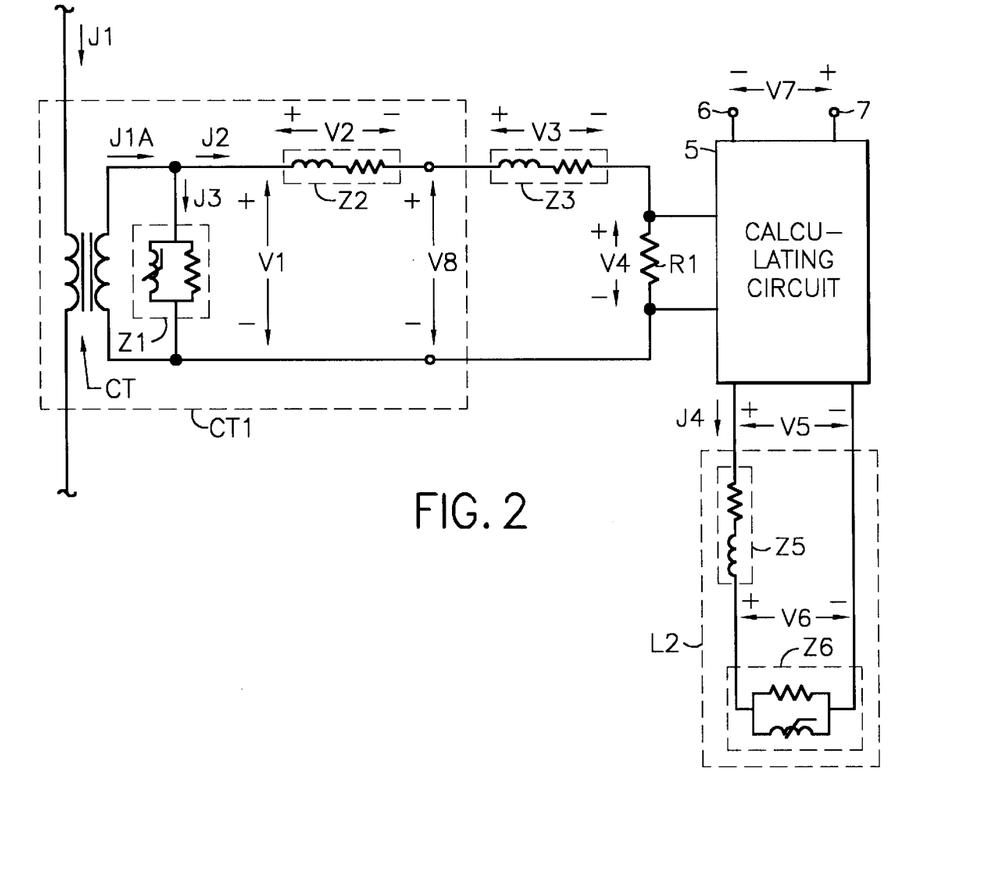
FIG. 2 is similar to FIG. 1, except that current transformer CT1 and inductor L2 are now shown modeled with lumped parameters.

FIG. 2 shows the same configuration as FIG. 1, except that current transformer CT1 and inductor L2 are now represented by approximate models for analysis purposes. As is often done to simplify transformer analysis, impedance parameters associated with the primary winding of current transformer CT1 have been transferred to the secondary side and incorporated into secondary circuit impedances. Ideal transformer CT acts as an ideal current transformer, causing current J1A to be exactly proportional to primary current J1. Impedance Z1 includes a resistive component (usually associated with core losses) and a nonlinear inductive component (usually associated with magnetizing current). Current J3 represents the exciting current. Voltage V1 is the voltage induced in the secondary winding by changing flux in the magnetic core. Impedance Z2 is usually thought of as accounting for stray winding impedances, with voltage V2 being the voltage drop caused by secondary current J2 flowing through impedance Z2.

Inductor L2 is modeled in a similar way as current transformer CT1, except that the ideal transformer is not included since there is no second winding. Impedance Z5 represents stray winding impedances, and impedance Z6 accounts for core losses and magnetizing properties. Voltage V6 is the voltage induced in the winding by changing flux in the magnetic core.

Still referring to FIG. 2, impedance Z2 normally has low impedance relative to impedance Z1. However, since current J2 is normally much larger than exciting current J3, the effects of both impedances Z1 and Z2 usually need to be considered for reasonable modeling accuracy. In a similar manner, with inductor L2, impedance Z5 normally has very low impedance relative to impedance Z6. Since impedances Z5 and Z6 are connected in series, the characteristics of impedance Z6 will dominate, and impedance Z5 may often be omitted without seriously affecting modeling accuracy. This simplification will be utilized throughout this disclosure. With this simplification, voltage V5 is equal to voltage V6.

Calculating circuit 5 functions the same in FIG. 2 as described for FIG. 1, but now some clarifications can be made utilizing the approximate models shown in FIG. 2. Calculating circuit 5 calculates induced voltage V1 (or, more strictly, voltage V5 which is equal to induced voltage V1 times a constant of proportionality) from voltage V4 and known characteristics of impedances Z2 and Z3 and resistor R1. Voltage V5 is made to have the same waveform as voltage V1, with the magnitude of voltage V5 scaled so as to produce a hysteresis cycle in inductor L2 similar to the hysteresis cycle in current transformer CT1 (with similar peak flux densities). Then current J4 is approximately proportional to exciting current J3. Calculating circuit 5 functions to multiply current J4 by an appropriate constant of proportionality (or "scale factor") and adds the result to current J2 to determine current J1A (which is exactly proportional to current J1). Calculating circuit 5 produces voltage output V7, which is an analog signal that is accurately proportional to current J1A and primary current J1.

Figure 3:
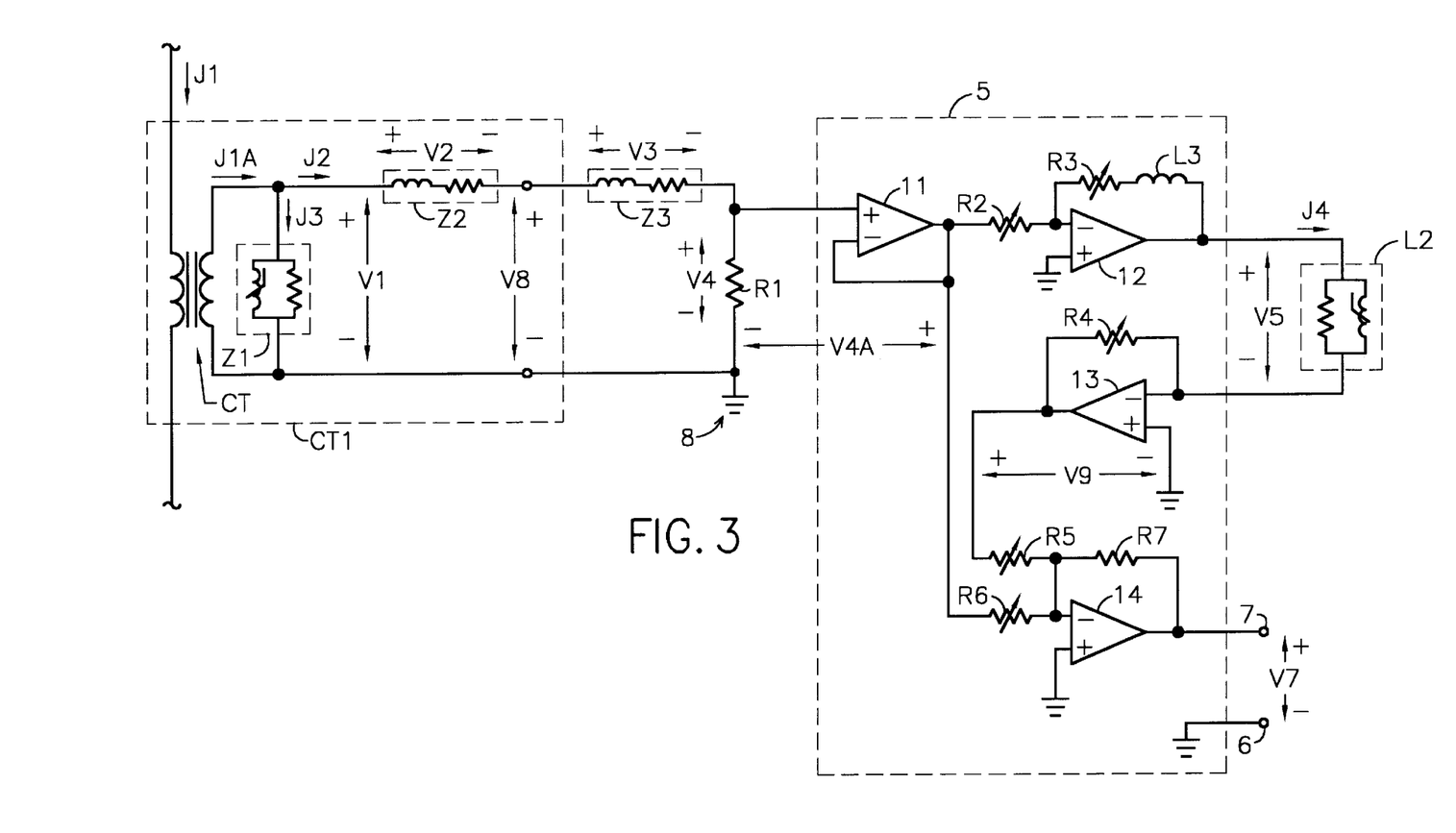
FIG. 3 is similar to FIG. 2, but with one possible embodiment of calculating circuit 5 shown in some detail. This embodiment utilizes analog calculating means.

FIG. 3 shows one way that calculating circuit 5 may be embodied. Operational amplifier 11 is configured as a buffer with very high input impedance. The output of operational amplifier 11 is voltage V4A, which is the same as voltage V4 referenced to common potential 8.

Operational amplifier 12, inductor L3, and adjustable resistors R2 and R3 are configured to produce an output voltage V5 that is proportional to voltage V1. To do this, resistor R3 is adjusted so that the ratio of inductance to resistance (of resistor R3 and inductor L3) is the same as the ratio of inductance to resistance of the sum of impedances Z2 and Z3 and resistor R1. This configuration effectively calculates voltage V5 to be equal to the instantaneous magnitude of secondary current J2 multiplied by a constant plus the rate of change of secondary current J2 multiplied by a second constant. If inductor L3 is omitted (shorted), then the resulting configuration would effectively calculate voltage V5 to be equal to the instantaneous magnitude of current J2 multiplied by a constant (this second calculation disregards any stray inductance present in the loop impedances).

To minimize the current rating required for operational amplifier 12, inductor L3 should be chosen to have high inductance compared to the inductances of impedances Z2 and Z3. Resistor R2 controls the magnitude of voltage V5. The magnitude of voltage V5 should be adjusted (with adjustable resistor R2) so that the hysteresis cycle of inductor L2 is similar to the hysteresis cycle of current transformer CT1 (with similar peak flux densities). Inductor L2 is now shown simplified, with impedance Z5 (shown in FIG. 2) omitted.

Operational amplifier 13 and adjustable resistor R4 are configured as a current-to-voltage converter with a virtual ground at the negative input terminal of operational amplifier 13. Output voltage V9 is proportional to current J4, with the waveform magnitude controlled by adjustable resistor R4.

Operational amplifier 14 and resistors R5, R6, and R7 are configured as a summing amplifier, calculating the sum of voltage V4A (which is proportional to secondary current J2) and voltage V9 (which is proportional to exciting current J3 and current J4). When the circuit is calibrated properly, output voltage V7 is accurately proportional to primary current J1. Resistors R5 and R6 are shown as being adjustable for calibration purposes. Resistor R6 may be adjusted to correct for tolerance errors of resistor R1. Either resistor R4 or R5 may by adjusted to make the exciting current signal the appropriate magnitude for addition to voltage V4A. Resistor R4 may be configured as a course adjustment, with resistor R5 providing a fine adjustment. Alternatively, either resistor R4 or R5 may be configured as a fixed resistor.

FIGS. 4A to 4D show typical waveforms associated with the operation of FIG. 3.

Figure 4A:
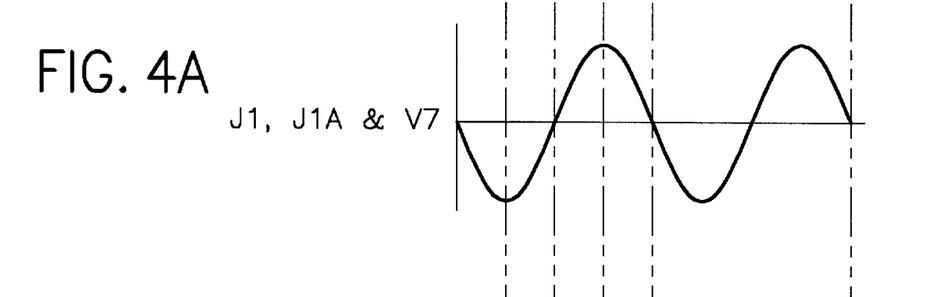
FIG. 4A shows a sinusoidal primary electric current waveform for reference.

FIG. 4A shows primary current J1, current J1A and voltage V7, which all have the same waveform (though the magnitudes are not necessarily the same). A simple sine wave is shown for simplicity of illustration, though actual power system current waveforms may be considerably distorted.

Figure 4B:
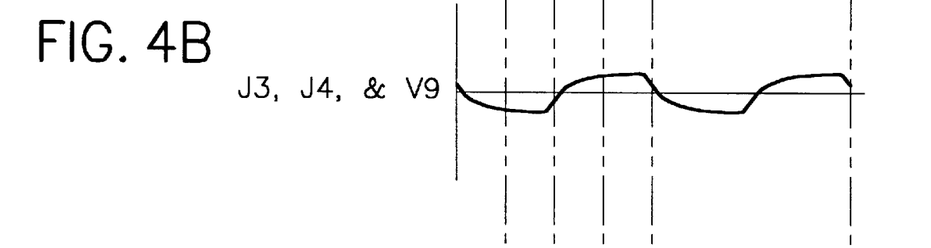
FIG. 4B shows the waveform of the current transformer exciting current, which is the primary source of error.

FIG. 4B shows exciting current J3, current J4, and voltage V9, which all have the same waveform. The waveform shown includes typical nonlinear effects associated with magnetic hysteresis curves.

Figures 4C, 4D:
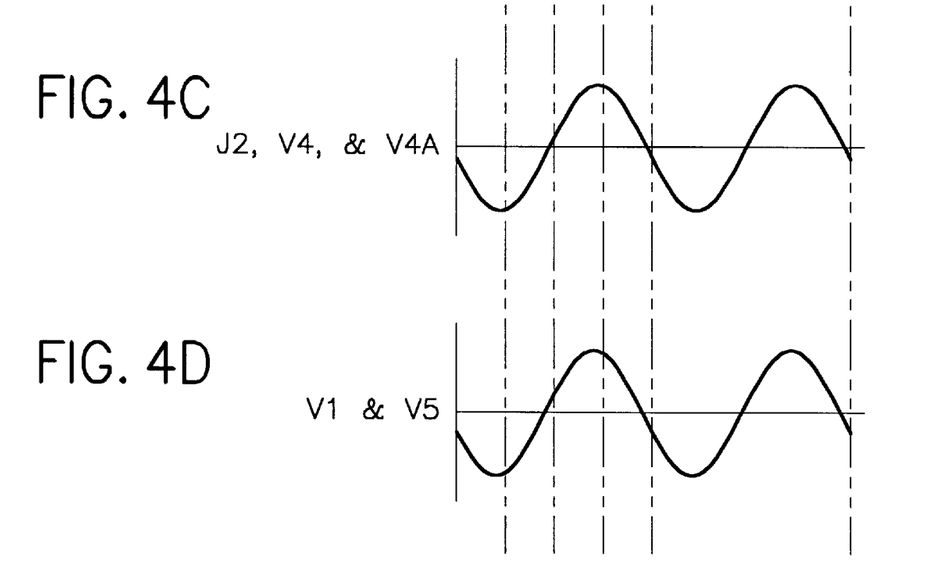
FIG. 4C shows the waveform of current transformer secondary current (also referred to as the "uncorrected signal").
FIG. 4D shows the approximate waveform of the induced voltage within the current transformer.

FIG. 4C shows secondary current J2, voltage V4, and voltage V4A, all having the same waveform. This waveform is effectively the waveform of FIG. 4A minus the waveform of FIG. 4B. Since FIG. 4B has distortion due to nonlinear hysteresis effects, FIG. 4C also has some distortion due to these same effects. However, since the magnitude of FIG. 4B is much smaller than the magnitude of FIG. 4A, the nonlinear effects are not readily visible in FIG. 4C. It is visually apparent, however, that the waveform of FIG. 4C is somewhat smaller than the waveform of FIG. 4A and slightly leads the waveform of FIG. 4A.

FIG. 4D shows induced voltage V1 and voltage V5, both having the same waveform. This waveform slightly leads the waveform of FIG. 4C due to the inductive components of impedances Z2 and Z3.

Figure 5:
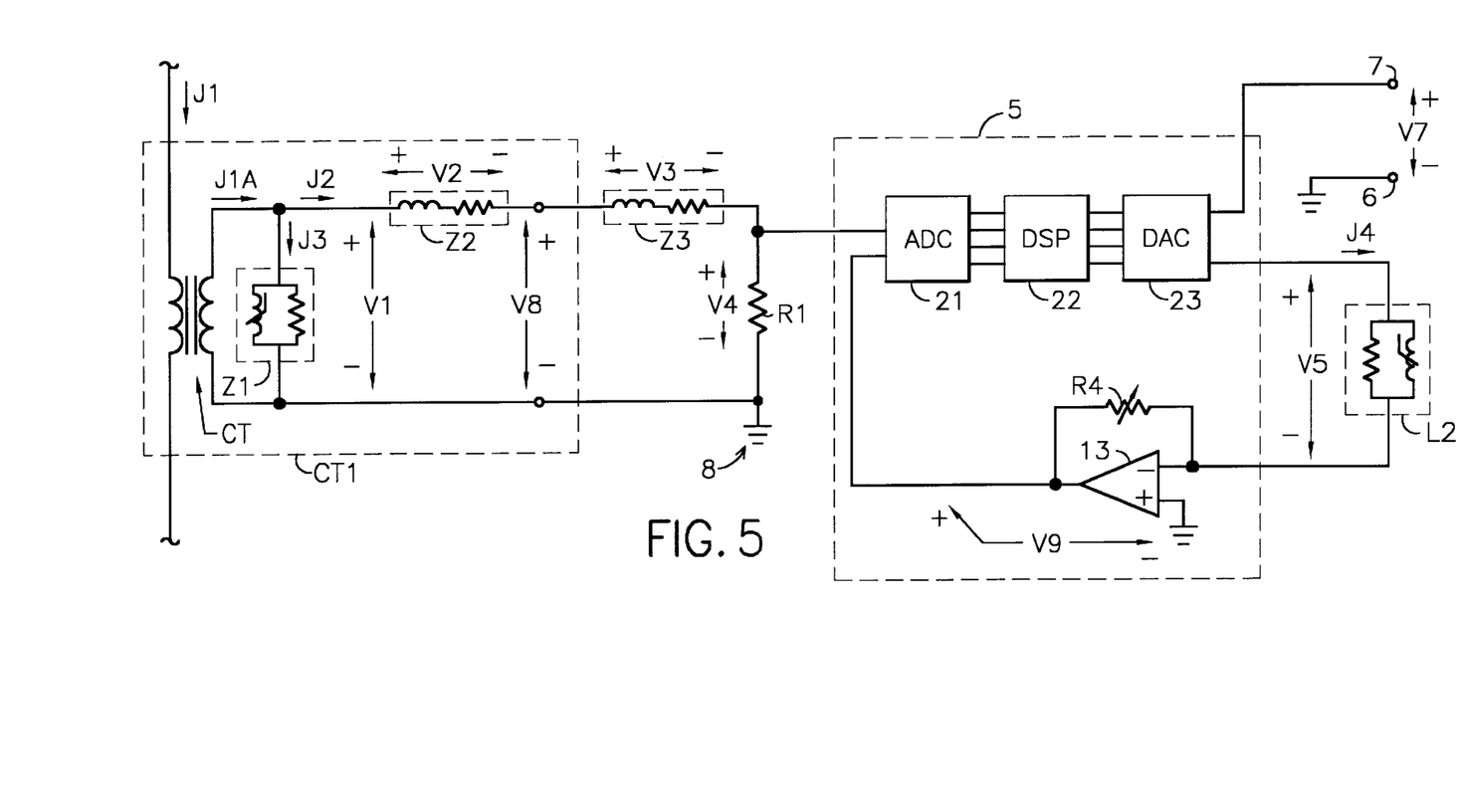
FIG. 5 shows an alternate embodiment of calculating circuit 5 utilizing digital calculating means.

FIG. 5 shows an alternate embodiment in which many of the analog calculations shown in FIG. 3 are replaced by digital calculations. An analog-to-digital converter 21 converts analog voltage V4 into a digital signal. The digital signal is communicated to a digital signal processor 22 via a prior-art communication interface which may vary considerably depending on the application. Digital signal processor 22 utilizes prior-art techniques to calculate voltage V1 based on digitized voltage V4 and known characteristics of impedances Z2 and Z3 and resistor R1. Digital signal processor 22 controls a digital-to-analog converter 23 (via a prior-art communication interface which may vary considerably depending on the application) to produce analog voltage V5, which is approximately proportional to voltage V1. Similar to previous figures, voltage V5 causes current J4 to flow through inductor L2. Similar to FIG. 3, operational amplifier 13 and adjustable resistor R4 convert current J4 into voltage signal V9, which is an input to analog-to-digital converter circuit 21. Analog-to digital converter circuit 21 converts voltage V9 into a digital signal for use by digital signal processor 22. Digital signal processor 22 adds the digitized values of voltages V4 and V9 together (with appropriate scale factors) to calculate current J1A and/or primary current J1. For applications that require an analog output signal, digital signal processor 22 communicates the result to digital-to-analog converter 23, which produces analog output voltage V7, which is accurately proportional to primary current J1. Alternatively, digital signal processor 22 may utilize the result for additional calculations, or may communicate the result digitally to other systems.

Figure 6:
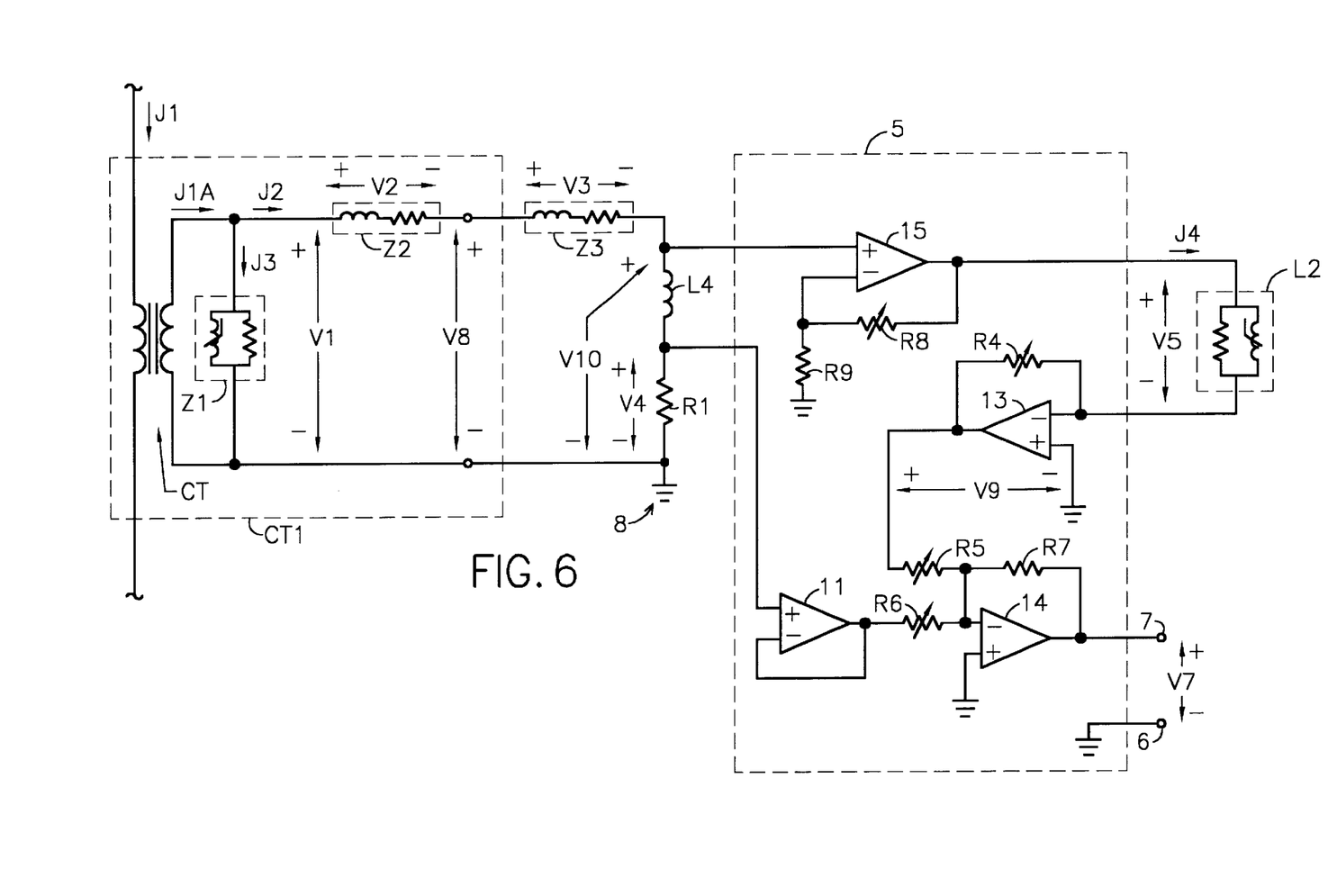
FIG. 6 shows a variation of the analog calculating means shown in FIG. 3.

FIG. 6 shows a variation of FIG. 3 in which an inductor L4 is added in series with resistor R1 to provide a voltage V10 that is proportional to induced voltage V1. Operational amplifier 15 and adjustable resistor R8 and resistor R9 are configured to multiply voltage V10 by an appropriate constant to produce voltage V5. Resistor R8 is adjustable for ease of calibration. The rest of the circuit functions in the manner described for FIG. 3. For proper operation, inductor L4 must be sized so that the ratio of inductance L4 to resistance R1 is the same as the ratio of inductance to resistance of the sum of impedances Z2 and Z3, so that voltage V1 and voltage V10 have the same phase angle. This is a significant disadvantage, as inductances with custom ratings are relatively expensive, and adjustable inductances with relatively high current ratings are not common. However, for some applications in which the current transformer and compensation circuit may be packaged together and mass-produced, this configuration may be preferable. Also, if the inductive components of impedances Z2 and Z3 are negligible, then inductor L4 may be omitted.

Figure 7:
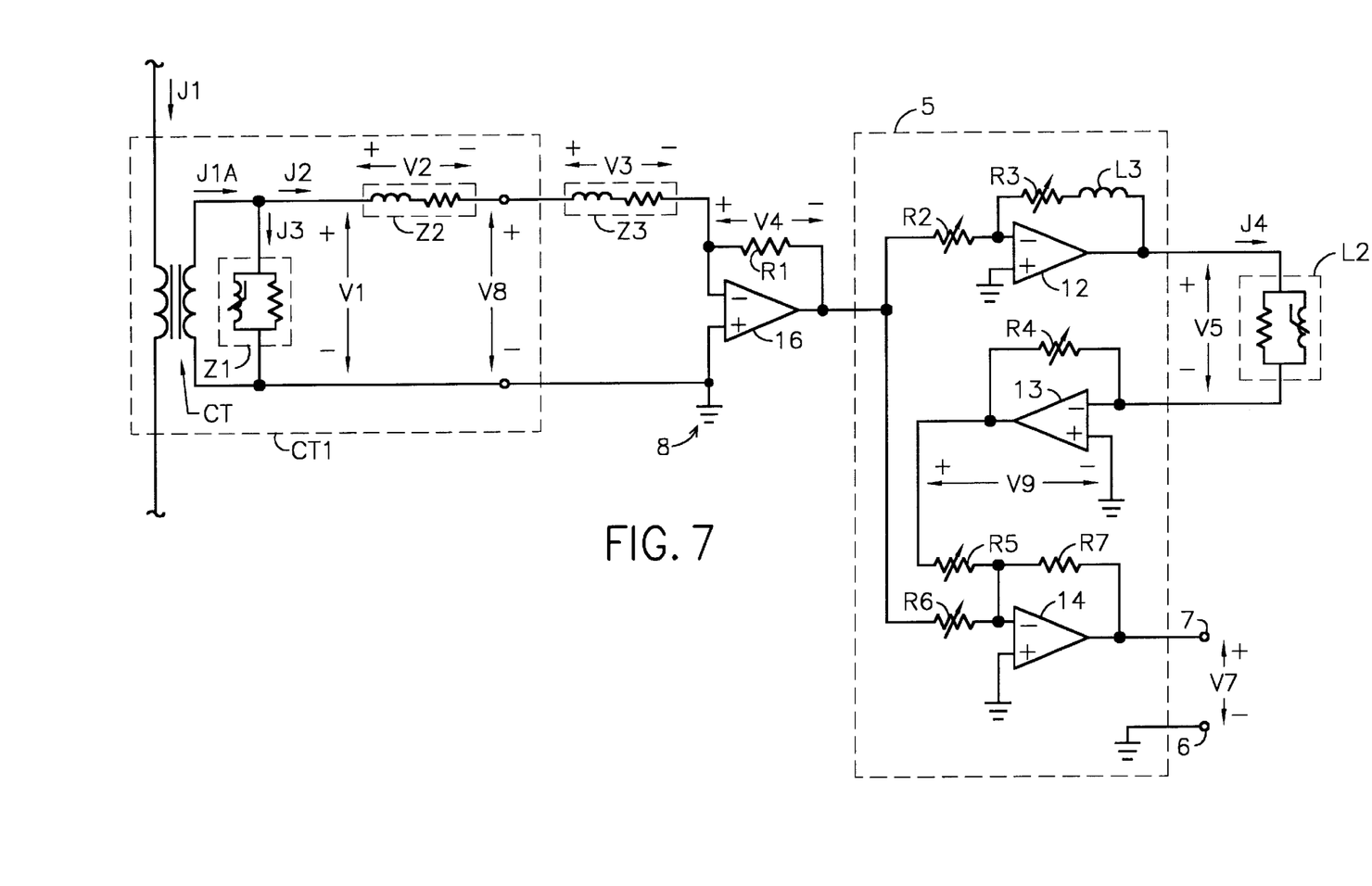
FIG. 7 shows an alternate embodiment that utilizes an active load to reduce the burden of the current transformer secondary circuit.

FIG. 7 shows another variation of FIG. 3. In FIG. 7, resistor R1 has been combined with an operational amplifier 16 to form an active load, thereby reducing the burden of the sensing device to near zero ohms (there is a virtual ground at the negative input of operational amplifier 16). The burden associated with impedances Z2 and Z3 is still present, however, so there is still error in secondary current J2 for which the present invention provides compensation. Current J2 still flows through resistor R1, thereby producing voltage V4. Voltage V4 now does not need buffering, so operational amplifier 11 (of FIG. 3) is not included. The rest of the circuit functions as described for FIG. 3. The main disadvantage to using an active load is that operational amplifier 16 must be rated for relatively high current, adding significantly to the cost of the circuit. The use of an active load to reduce current transformer burden is described in detail in U.S. Pat. No. Re. 28,851 to Milkovic (reissued 1976) for a "Current Transformer with Active Load Termination."

Surge protection (not shown) for the active load of FIG. 7 may be provided by connecting 2 diodes (in parallel and with opposite polarity) across the input terminals of operational amplifier 16. Since the voltage across the input terminals is normally zero volts, no current flows through the diodes until operational amplifier 16 becomes saturated or fails, in which case the diodes will limit the input voltage to about one volt.

Summarizing, a key aspect of the invention is the real-time determination of induced voltage in a current transformer (voltage V1 calculated as voltage V5). The induced voltage is calculated from a parameter related to secondary current and known characteristics of loop impedances through which secondary current flows. The parameter related to secondary current may be the secondary current itself, or a voltage associated with secondary current flowing through an impedance. (The term "loop impedances" is intended to refer to impedance elements through which a particular current flows; current theoretically always flowing in some form of loop configuration).

A second key aspect of the invention is the application of the calculated induced voltage to an inductor having similar magnetic characteristics as the current transformer. By scaling the applied voltage properly, the current flowing in the inductor (current J4) is approximately proportional to the exciting current of the current transformer (current J3). The current in the inductor is measured, and, by applying an appropriate constant of proportionality (or "scale factor"), the exciting current of the current transformer is determined. A corrected secondary current may then be calculated by adding the calculated exciting current to the measured secondary current.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. A method for compensation of error associated with a current transformer;

said current transformer comprising a first magnetic core and a secondary winding wrapped around said first magnetic core; a primary electric current flowing in a conductor configured as a primary winding of said current transformer;

a secondary electric current flowing in said secondary winding due to the transformer action of said current transformer; the magnitude of said secondary electric current being approximately proportional to said primary electric current; said secondary electric current being proportionally smaller than said primary electric current by the turns ratio of said current transformer; said secondary electric current having an error that is primarily due to an exciting current associated with said current transformer;

said method producing a corrected current signal that is more accurately proportional to said primary electric current than is said secondary electric current;

said method comprising the steps of:
(a) first, determine a first voltage that is approximately proportional to an induced voltage associated with changing magnetic flux in said first magnetic core;
(b) second, determine said exciting current by applying said first voltage to an inductor and measuring a third current thereby caused to flow in said inductor;
(c) third, calculate said corrected current signal by adding said exciting current to said secondary electric current.

2. The method of claim 1 wherein said exciting current is calculated to be approximately equal to said third current multiplied by a constant of proportionality.

3. The method of claim 1 wherein said inductor has similar magnetic characteristics as said current transformer.

4. The method of claim 1 wherein said inductor comprises a second magnetic core and a third winding; and the magnitude of said first voltage is coordinated with said inductor so that the peak magnetic flux density in said second magnetic core is approximately equal to the peak magnetic flux density in said first magnetic core.

5. The method of claim 1 wherein said steps are performed continuously, thereby causing said corrected current signal to continuously be accurately proportional to said primary electric current.

6. The method of claim 5 wherein said method utilizes analog calculating means to perform each of said steps.

7. The method of claim 5 wherein said method utilizes digital calculating means to perform said first step and said third step.

8. The method of claim 1 wherein said first voltage is calculated from one or more parameters related to said secondary electric current.

9. The method of claim 8 wherein said first voltage is calculated from a second voltage produced by said secondary electric current flowing through an impedance.

10. The method of claim 8 wherein the instantaneous magnitude of said first voltage is calculated as the instantaneous magnitude of said secondary electric current multiplied by a constant of proportionality.

11. The method of claim 8 wherein the instantaneous magnitude of said first voltage is calculated as the instantaneous magnitude of said secondary electric current multiplied by a constant of proportionality plus the rate of change of said secondary electric current multiplied by a second constant of proportionality.

12. Apparatus for compensation of error associated with a current transformer;

said current transformer comprising a first magnetic core and a secondary winding wrapped around said first magnetic core; a primary electric current flowing in a conductor configured as a primary winding of said current transformer;

a secondary electric current flowing in said secondary winding; said secondary electric current being approximately proportional to said primary electric current; said secondary electric current being proportionally smaller than said primary electric current by the turns ratio of said current transformer; an error being present in said secondary electric current that is primarily due to an exciting current associated with said current transformer;

said apparatus calculating a corrected current that is more accurately proportional to said primary electric current than is said secondary electric current;

said apparatus comprising a calculating means and an inductor;

said inductor comprising a second magnetic core and a third winding;

said calculating means receiving an information signal related to said secondary electric current; said calculating means producing a first voltage that is approximately proportional to an induced voltage in said secondary winding; said induced voltage being approximately proportional to the rate of change of magnetic flux within said first magnetic core;

said first voltage being applied to said third winding thereby causing a third current to flow in said third winding; said third current being approximately proportional to said exciting current;

said calculating means further calculating said corrected current by adding a value proportional to said secondary electric current to a value proportional to said third current.

13. The apparatus of claim 12 wherein said second magnetic core has magnetic characteristics that are similar to the magnetic characteristics of said first magnetic core.

14. The apparatus of claim 12 wherein said calculating means further applies a scale factor to said first voltage so that the peak flux density in said second magnetic core is approximately equal to the peak flux density within said first magnetic core.

15. The apparatus of claim 12 wherein said calculating means performs all calculations continuously based on instantaneous values of parameters that vary with time.

16. The apparatus of claim 15 wherein said calculating means comprises operational amplifiers configured in such a way as to calculate said first voltage and said corrected current.

17. The apparatus of claim 15 wherein said calculating means comprises a digital calculating means configured in such a way as to calculate said first voltage and said corrected current.

18. The apparatus of claim 12 wherein said information signal is a second voltage produced by said secondary electric current flowing through an impedance.

19. The apparatus of claim 12 wherein said calculating means calculates the instantaneous magnitude of said first voltage as the instantaneous magnitude of said secondary electric current multiplied by a constant of proportionality.

20. The apparatus of claim 12 wherein said calculating means calculates the instantaneous magnitude of said first voltage as the instantaneous magnitude of said secondary electric current multiplied by a scale factor plus the rate of change of said secondary electric current multiplied by a second scale factor.

* * * * *